United States Patent
Isaji

(10) Patent No.: US 9,368,750 B1
(45) Date of Patent: Jun. 14, 2016

(54) METHOD FOR FABRICATING INTERMEDIATE MEMBER OF ELECTRONIC ELEMENT AND METHOD FOR FABRICATING ELECTRONIC ELEMENT

(71) Applicant: Panasonic Intellectual Property Management Co., Ltd., Osaka (JP)

(72) Inventor: Yuka Isaji, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/932,897

(22) Filed: Nov. 4, 2015

(30) Foreign Application Priority Data

Dec. 4, 2014 (JP) ................................. 2014-245870

(51) Int. Cl.
- *H01L 21/00* (2006.01)
- *H01L 21/84* (2006.01)
- *H01L 51/52* (2006.01)
- *H01L 51/56* (2006.01)

(52) U.S. Cl.
CPC ............ *H01L 51/5256* (2013.01); *H01L 51/56* (2013.01)

(58) Field of Classification Search
CPC ..................... H01L 21/0262; H01L 21/02326; H01L 21/02672; H01L 27/1251; H01L 27/0814; H01L 29/4908; H01L 29/6603; H01L 51/5287; H01L 51/5296; H01L 51/0508; H01L 51/525; H01L 51/56; H01L 51/5256
USPC ................. 438/149, 98, 82, 474, 753, 680; 257/E21.006, E21.134, E21.17, 257/E21.278, E21.293, E21.267, E21.411, 257/E21.053
See application file for complete search history.

(56) References Cited

U.S. PATENT DOCUMENTS

| | | | | |
|---|---|---|---|---|
| 5,319,479 A * | 6/1994 | Yamada | .................. | C23C 14/06 257/E45.001 |
| 8,389,983 B2 * | 3/2013 | Seo | ...................... | H01L 51/5256 257/40 |
| 8,415,208 B2 * | 4/2013 | Takayama | ............ | H01L 21/2007 438/149 |
| 8,962,106 B2 * | 2/2015 | Lee | ................... | G02F 1/133707 349/123 |
| 9,165,849 B2 * | 10/2015 | Hatanaka | ................. | H01L 23/29 |
| 2003/0032210 A1 | 2/2003 | Takayama et al. | | |
| 2011/0140164 A1 | 6/2011 | Seo et al. | | |

FOREIGN PATENT DOCUMENTS

| | | |
|---|---|---|
| JP | 2003-174153 | 6/2003 |
| JP | 2005-075978 | 3/2005 |
| JP | 2007-220646 | 8/2007 |
| JP | 2008-072087 | 3/2008 |
| JP | 2009-190186 | 8/2009 |
| JP | 2011-124228 | 6/2011 |
| JP | 2014-186850 | 10/2014 |

* cited by examiner

*Primary Examiner* — David Nhu

(74) *Attorney, Agent, or Firm* — Greenblum & Bernstein, P.L.C.

(57) ABSTRACT

A method for fabricating an intermediate member of an electronic element, comprises: preparing a glass substrate as a support substrate having a first surface; forming a first inorganic film that contains silicon and has a second surface and a third surface opposite to the second surface, in such a manner that the first surface of the support substrate is in contact with the second surface of the first inorganic film; forming a first polyimide film containing fluorine on the third surface of the first inorganic film; and forming a second inorganic film containing silicon on the first polyimide film.

13 Claims, 7 Drawing Sheets

| SAMPLE | SUBSTRATE | HEATING |
|---|---|---|
| 1 | GLASS | HEATED |
| 2 | GLASS | NOT HEATED |
| 3 | Si WAFER | HEATED |
| 4 | Si WAFER | NOT HEATED |

METHOD FOR FABRICATING INTERMEDIATE MEMBER OF ELECTRONIC ELEMENT AND METHOD FOR FABRICATING ELECTRONIC ELEMENT

BACKGROUND

1. Technical Field

The present disclosure relates to a method for fabricating an intermediate member of an electronic element and a method for fabricating an electronic element.

2. Description of the Related Art

In the field of electronics, materials likely to be altered by oxygen, moisture, and the like are sometimes used. Examples of devices (i.e. electronic elements) containing such materials include illuminations, organic electroluminescent (EL) devices such as organic EL displays, and solar cells.

For example, an organic EL device includes an organic EL element including two electrodes and an organic light-emitting layer interposed therebetween. The organic EL element is vulnerable to moisture and therefore needs to be protected with a protective film having gas barrier properties. For the protective film, an inorganic film with high gas barrier properties is used.

However, the inorganic film has pinholes capable of allowing moisture to pass through. In the case of using the inorganic film alone as a single-layer protective film, moisture may possibly enter the pinholes. If moisture enters the organic EL element through the pinholes, the electrodes of the organic EL element are corroded with the moisture. A region containing the corroded electrodes is a dark spot where the organic EL element emits no light.

Japanese Unexamined Patent Application Publication No. 2007-220646 discloses a multilayer structure, including a plurality of inorganic films, for enhancing gas barrier properties. According to Japanese Unexamined Patent Application Publication No. 2007-220646, the multilayer structure enhances the bending resistance and sealing properties of a protective film. However, the multilayer structure has a problem that stress needs to be controlled, since the multilayer structure includes the inorganic films.

Japanese Patent No. 5362689 discloses a multilayer structure, including inorganic films and an organic film placed therebetween, for relieving stress.

SUMMARY

In one general aspect, the techniques disclosed here feature a method for fabricating an intermediate member of an electronic element, comprising: preparing a glass substrate as a support substrate having a first surface; forming a first inorganic film that contains silicon and has a second surface and a third surface opposite to the second surface, in such a manner that the first surface of the support substrate is in contact with the second surface of the first inorganic film; forming a first polyimide film containing fluorine on the third surface of the first inorganic film; and forming a second inorganic film containing silicon on the first polyimide film.

According to the above aspect, the occurrence of unintentional delamination can be reduced.

It should be noted that general or specific embodiments may be implemented as an intermediate member, an element, a device, an apparatus, a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Figure 1:
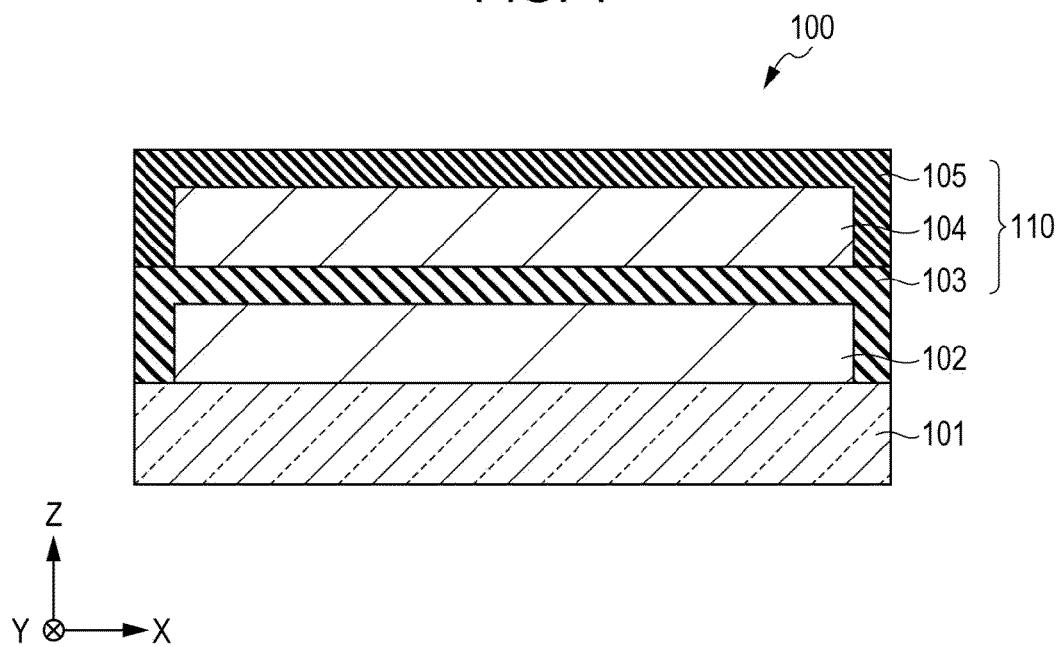
FIG. 1 is a sectional view of a comparative example of an intermediate member including a support substrate and a protective film having a multilayer structure.

DETAILED DESCRIPTION (Underlying Knowledge Forming Basis of the Present Disclosure)

In the field of electronics, materials likely to be altered by oxygen, moisture, and the like are sometimes used as materials for electronic elements as described above. Therefore, protective films for protecting such electronic elements from oxygen and moisture are required to have high gas barrier properties. In the field of food and medical care, gas barrier properties are also desirably high.

An organic EL device (an example of an electronic element) needs to have such gas barrier properties that the time taken for moisture to reach an organic EL element is longer than the storage life of the organic EL device. Sealing properties required for protective films for organic EL displays include a moisture vapor transmission rate of $1\times10^{-6}$ g/m²/day or less. In the case where an upper and lower substrate used are glass substrates (i.e. not flexible substrates), the glass substrates have very low moisture permeability and therefore end portions only may be taken into account for the ingress of moisture. However, flexible organic EL displays recently attracting attention include an upper and lower substrate made of plastic. Since the moisture vapor transmission rate of plastic is high, 1 g/m²/day to 100 g/m²/day, protective films are necessary.

The protective films used are usually inorganic films, such as silicon nitride films, having excellent sealing properties. However, defects such as pinholes are present in the inorganic films, such as silicon nitride films, as described above. Therefore, it is difficult to prevent the ingress of moisture using a single film.

(Problem with multilayer structure including a plurality of inorganic films)

It is investigated that the infiltration rate of moisture is reduced in such a manner that pinholes are made discontinuous by stacking several silicon nitride films (or by stacking a plurality of inorganic films). The silicon nitride films are formed by capacitively coupled plasma chemical vapor deposition (CCP-CVD) that is widely used as a mass-production technique. In this deposition technique, source gases are likely to be dissociated at high temperature. Therefore, it is possible to form a silicon nitride film which contains few intra-film impurities (e.g. hydrogen derived from the source gases). The formed silicon nitride film is dense, and has excellent sealing properties.

However, the thermal residual stress increases due to the difference in thermal expansion coefficient between the silicon nitride film and a substrate when the temperature is returned from the deposition temperature to room temperature in a step of forming the silicon nitride film. Therefore, in the case of a structure obtained by stacking inorganic films, it is concerned that a completed display warps significantly. The stress $\sigma_T$ is given by the following equation:

$$\sigma_T = \int_{T2}^{T1} \left( \frac{E_f}{1-\upsilon_f} \right) (\alpha_f - \alpha_s) dT \quad (1)$$

where $E_f$ is the Young's modulus of a thin film (e.g. the silicon nitride film) that is located on a substrate, $V_f$ is the Poisson ratio of the thin film, $\alpha_f$ is the thermal expansion coefficient of the thin film, $\alpha_s$ is the thermal expansion coefficient of the substrate, and T is the temperature.

As is clear from Equation (1), the stress $\sigma_T$ is large due to the difference between the thermal expansion coefficient $\alpha_f$ of the substrate and the thermal expansion coefficient $\alpha_s$ of the silicon nitride film. Therefore, attempts have been made to relieve stress by providing an organic film between inorganic films.

(Problem with Multilayer Structure Including a Plurality of Inorganic Films and Organic Films Placed Therebetween)

For example, in the case of an organic EL display, in order to increase the reliability of properties of thin-film transistors (TFTs), organic films in the multilayer structure need a material with excellent high-temperature resistance. An organic material with excellent high-temperature resistance is, for example, polyimide (PI), which has high thermal stability. PI has excellent thermal stability, electrical properties, and mechanical properties and therefore is widely used in the field of electronics and aerospace.

However, general-propose PI has a problem that general-propose PI is insufficiently transparent because the visible light absorption edge of general-propose PI is close to 500 nm and general-propose PI is colored brown. Furthermore, general-propose PI generally has a problem with high water absorption. In contrast, fluorinated PI is an organic material having excellent properties such as low moisture absorption, low dielectric constant, increased transmittance, increased thermal decomposition temperature, and high solubility.

Even in the case of using fluorinated PI, different materials such as organic films and inorganic films are stacked. Therefore, there is a problem in that delamination occurs conceivably due to stress, a difference in coefficient of thermal expansion, or low adhesion. The present inventor actually prepared a protective film including a fluorinated PI film, resulting in that delamination occurred actually in a step of stacking an organic film and an inorganic film.

(Factor of Delamination)

Therefore, the present inventor performed investigations to clarify the cause of delamination, and as a result, obtained new findings on a factor affecting delamination as described below.

In light of the above problems, the present inventor actually prepared a sample of an intermediate member including a protective film having a multilayer structure composed of an inorganic film (e.g. a silicon nitride film) and an organic film (e.g. a fluorinated PI film) and a support substrate.

FIG. 1 is a sectional view of the actually prepared sample of the intermediate member including the support substrate and the protective film having the multilayer structure according to a comparative example. FIG. 1 illustrates the configuration of the intermediate member in a stage prior to the formation of a circuit element such as a TFT.

As shown in FIG. 1, an intermediate member 100 includes a glass substrate 101 which is a support substrate, a first PI film 102 which is a flexible substrate, and a protective film 110.

The glass substrate 101 is an example of a support substrate used to prepare an electronic element and is removed from the electronic element after the preparation of the electronic element. Herein, the electronic element is a flexible device. The electronic element includes the first PI film 102 and the protective film 110.

The first PI film 102 is an example of an organic film made of an organic material containing at least fluorine and is placed in a region on a surface of the glass substrate 101.

The protective film 110 includes a first silicon nitride (SiN) film 103, a second PI film 104, and a second SiN film 105.

The first SiN film 103 is an example of an inorganic film made of an inorganic material containing at least silicon (Si) and is placed so as to cover the upper surface and side surfaces of the first PI film 102, which is placed on the glass substrate 101. The second PI film 104 is an example of an organic film made of an organic material and is placed in a region on a surface of the first SiN film 103. The second SiN film 105 is an example of an inorganic film made of an inorganic material and is placed so as to cover the upper surface and side surfaces of the second PI film 104, which is placed on the first SiN film 103.

The first PI film 102 was formed on the glass substrate 101 by applying a predetermined organic material to the glass substrate 101. The first SiN film 103, which was an inorganic film corresponding to a first layer, was formed on the first PI film 102. Furthermore, the second PI film 104, which was an organic film corresponding to a second layer, was formed on the first SiN film 103, whereby a multilayer structure was prepared. As a result, delamination occurred during a process of heating of the second PI film 104.

The composition of delaminated surfaces was measured by infrared (IR) spectroscopy. As a result, it became clear that delamination occurred at the interface between the glass substrate 101 and the first PI film 102 and the interface between the first PI film 102 and the first SiN film 103.

Figure 2:
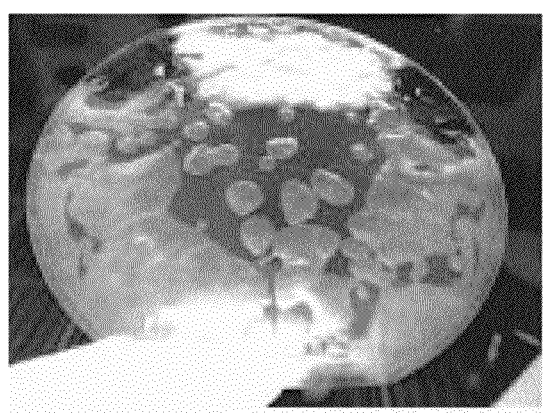
FIG. 2 is a view showing an example of the state of delamination occurring in a comparative example.
Figure 2:
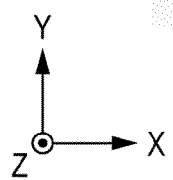
Figures 3, 4:
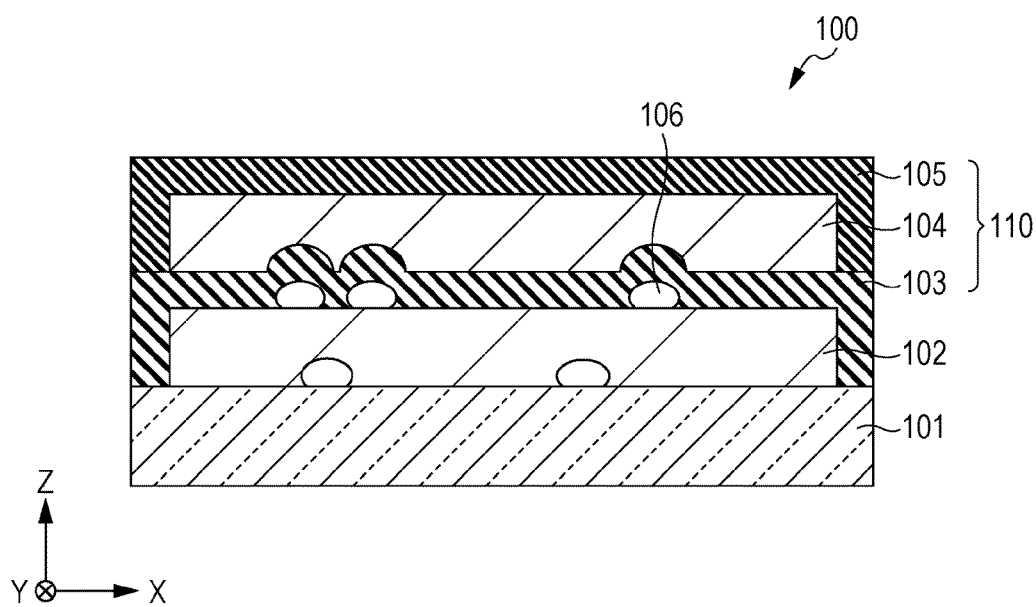
FIG. 3 is a sectional view showing an example of the state of delamination occurring in a comparative example.
FIG. 4 is a table showing conditions for preparing verification samples in an embodiment.

FIG. 2 is a view showing an example of the state of delamination (i.e. film peeling) occurring in the comparative example. FIG. 3 is a sectional view showing an example of the state of delamination (film peeling) occurring in the comparative example. FIGS. 2 and 3 illustrate the state of delamination occurring at a stage prior to the formation of a circuit element such as an organic EL element, that is, a stage of preparing a protective film.

Results of IR measurement reveal that bubbles 106 have been generated between the first PI film 102 and the glass substrate 101 and between the first PI film 102 and the first SiN film 103 as shown in FIG. 3. Delamination was caused by the bubbles 106. That is, delamination occurred at the interface between the first PI film 102 and the glass substrate 101 and the interface between the first PI film 102 and the first SiN film 103.

The present inventor thought that the cause of the delamination was probably residual stress or interlayer adhesion, and varied the stress of the first SiN film 103, which corresponds to a first layer, compression stress, tensile stress, and zero within a variable range. However, the degree of delamination was not improved. The present inventor surface-treated the glass substrate 101 and the first PI film 102 in order to increase interlayer adhesion. However, the degree of delamination was not improved either. Thus, the present inventor searched factors associated with delamination regardless of deposition conditions. As a result, it became clear that delamination is eliminated by replacing the glass substrate 101 with a silicon substrate.

Based on these new findings, the present inventor conceived a method for fabricating an intermediate member of an electronic element according to an aspect of the present disclosure and a method for fabricating an electronic element according to another aspect of the present disclosure.

A method for fabricating an electronic element according to an aspect of the present disclosure includes a step of preparing a support substrate made of glass, a step of forming a first inorganic film having at least one portion containing silicon on at least one surface of the support substrate, a step of forming a first polyimide film having at least one portion containing fluorine on the first inorganic film, and a step of forming a second inorganic film having at least one portion containing silicon on the first polyimide film.

In the method for fabricating the electronic element, the first inorganic film, which has at least one portion containing silicon (Si), is formed between the support substrate (i.e. glass substrate) and the first polyimide (PI) film, which has at least one portion containing fluorine; hence, delamination can be prevented.

Delamination occurs probably because fluorine contained in a first PI film reacts with silicon oxide and aluminium hydroxide contained in a glass substrate to generate bubbles of oxygen and the like as described in detail in embodiments. Therefore, an inorganic film is formed between the glass substrate and the first PI film such that fluorine contained in the first PI film does not react with the glass substrate. Thus, in the method for fabricating the electronic element, delamination can be effectively prevented.

The method may further include, for example, a step of separating the first inorganic film from the support substrate by irradiating the support substrate with a laser beam after the step of forming the second inorganic film.

After a flexible device is prepared, the flexible device can be separated from the support substrate by performing the step of separating the first inorganic film from the support substrate.

The method may further include, for example, a step of forming a second polyimide film on the second inorganic film after the step of forming the second inorganic film. The method may further include a step of forming a circuit element on the second polyimide film after the step of forming the second polyimide film. In the step of forming the circuit element, a thin-film transistor may be formed.

In experiments, delamination occurred during a process of heating for forming a circuit element, particularly a TFT. Therefore, the method is useful in the case where a process of heating is performed in the course of preparing a flexible device.

The first inorganic film may contain, for example, at least one selected from the group consisting of silicon nitride, silicon oxynitride, silicon oxide, and silicon oxycarbide.

Delamination can be prevented in such a manner that the first inorganic film is formed using a material unreactive with fluorine, that is, for example, at least one selected from the group consisting of silicon nitride, silicon oxynitride, and silicon oxide.

The second inorganic film may contain, for example, a material impermeable to oxygen. The second inorganic film may contain at least one selected from the group consisting of silicon nitride, silicon oxynitride, silicon oxide, silicon oxycarbide, and metal.

In a conventional method for fabricating an electronic element, when a second inorganic film is made of a material impermeable to oxygen (a material having oxygen barrier properties), bubbles (oxygen and the like) generated at the interface between a first PI film and a glass substrate cannot pass through the second inorganic film and stay between the first PI film and the second inorganic film. Therefore, delamination occurs between the first PI film and the second inorganic film. Performing a step of forming a first inorganic film is particularly effective in preventing delamination in the fabrication of such an electronic element. The material impermeable to oxygen may be a material containing at least one selected from the group consisting of silicon nitride, silicon oxynitride, silicon oxide, silicon oxycarbide, and metal.

The second polyimide film may contain, for example, a hygroscopic material.

When the second polyimide film contains the hygroscopic material, the ingress of moisture into an electronic element can be reduced.

These comprehensive or particular embodiments may be realized in the form of an intermediate member or electronic element fabricated by the method.

Embodiments are described below in detail with reference to the accompanying drawings.

The embodiments show comprehensive or particular examples. Values, shapes, materials, components, the positions of the components, and the connection topology of the components described in the embodiments are for exemplification only and are not intended to limit the present disclosure. Among the components in the embodiments, those that are not described in any independent claim which represents the highest conception are arbitrary components.

Embodiments

A method for fabricating an electronic element according to an embodiment, an intermediate member, and the electronic element are described below with reference to FIGS. 4 to 13.

1. Verification of Factor of Delamination

As described above, the factor of delamination is not residual stress or interlayer adhesion but is probably another one. As described above, in the case where the glass substrate 101 was replaced with the silicon substrate (i.e. silicon wafer), delamination did not occur. The present inventor prepared samples using a silicon wafer instead of the glass substrate 101 and samples using the glass substrate 101. Since delamination (i.e. film peeling) occurred during the process of heating of the second PI film 104, the present inventor thought that influence depends on whether heating was performed. Therefore, a sample was prepared using the glass substrate 101 by heating, another sample was prepared using the glass substrate 101 without heating, another sample was prepared using the silicon wafer by heating, and another sample was prepared using the silicon wafer without heating. Preparation conditions are shown in FIG. 4.

In this embodiment, each of the samples 1 to 4 was prepared in such a manner that a PI material containing fluorine was applied to the glass substrate 101 or the silicon wafer using a spin coater and was then heated and a first SiN film 103 was formed by capacitively coupled plasma chemical vapor deposition (CCP-CVD). Then, each of the samples 1 and 3 was processed by heating.

After the samples (i.e. intermediate members) 1 to 4 were prepared, the glass substrate 101 or the silicon wafer and a first PI film 102 of each of the four samples were separated from each other. For each of Samples 1 and 2, the composition of a surface of the glass substrate 101 that was in contact with the first PI film 102 and the composition of a surface of the first PI film 102 that was in contact with the glass substrate 101 were measured by X-ray photoelectron spectroscopy (XPS). Furthermore, for each of Samples 3 and 4, the composition of a surface of the silicon wafer that was in contact with the first PI film 102 and the composition of a surface of the first PI film 102 that was in contact with the silicon wafer were measured by XPS.

In each of Samples 1 to 4, in order to verify delamination (shown in FIGS. 1 to 3) occurring prior to the formation of a circuit element (such as an organic EL element), the glass substrate 101 or the silicon wafer was separated from the other parts after the preparation of the protective film. Therefore, there was no sealing film over the circuit element, such as an organic EL element.

In the measurement of Samples 1 to 4 by XPS, information on bonding energy such as C 1s (the energy of the 1s orbital of C), N 1s, O 1s, F 1s, Mg 2p, Al 2p, Si 2p, or Ca 2p was obtained.

Figure 5:
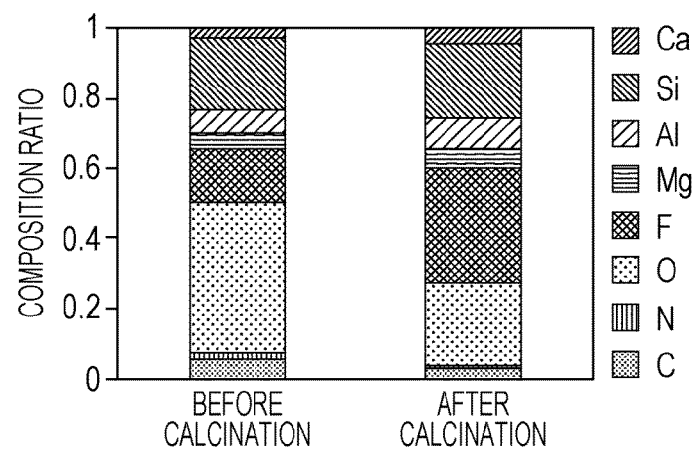
FIG. 5 is a graph showing an example of the composition of a glass substrate used for verification in an embodiment.
Figure 6A:
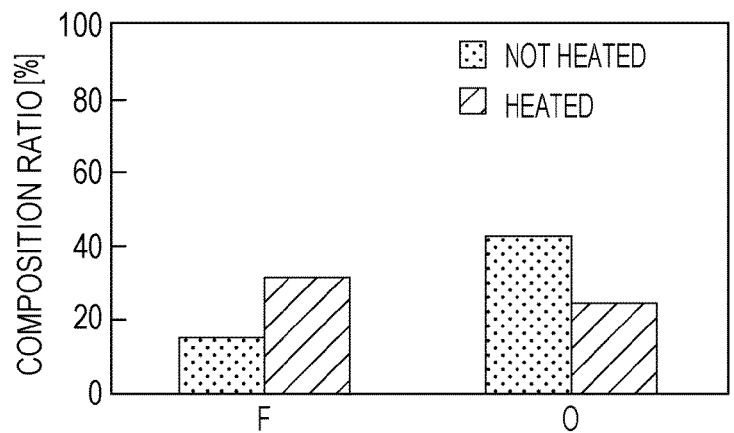
FIG. 6A is a graph showing XPS measurement results of a glass substrate in the case of using the glass substrate as a support substrate.
Figure 6B:
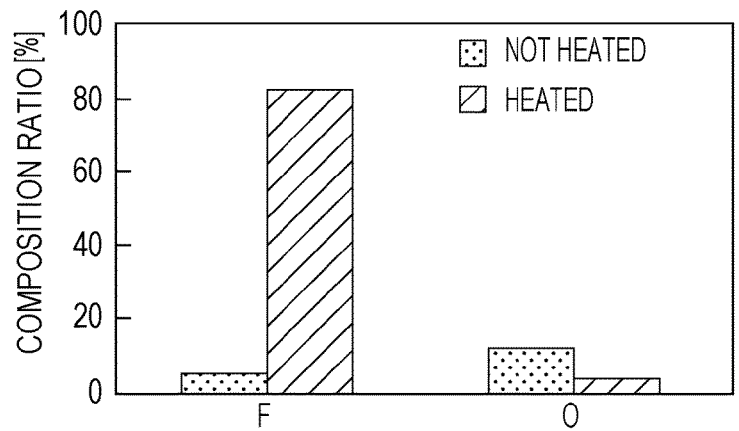
FIG. 6B is a graph showing XPS measurement results of a first PI film in the case of using a glass substrate as a support substrate.
Figure 7A:
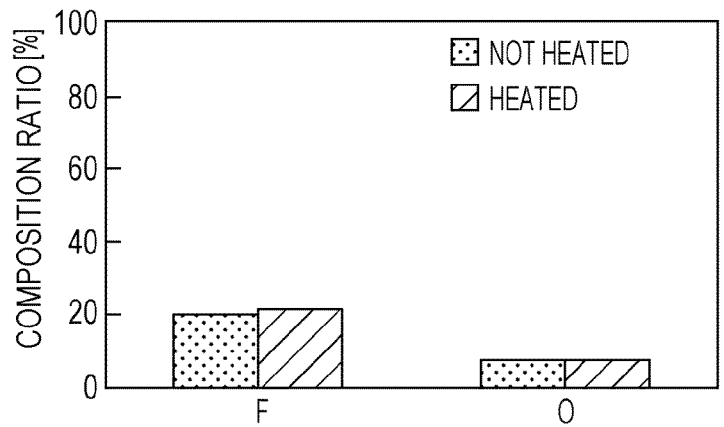
FIG. 7A is a graph showing XPS measurement results of a silicon substrate in the case of using the silicon substrate as a support substrate.
Figure 7B:
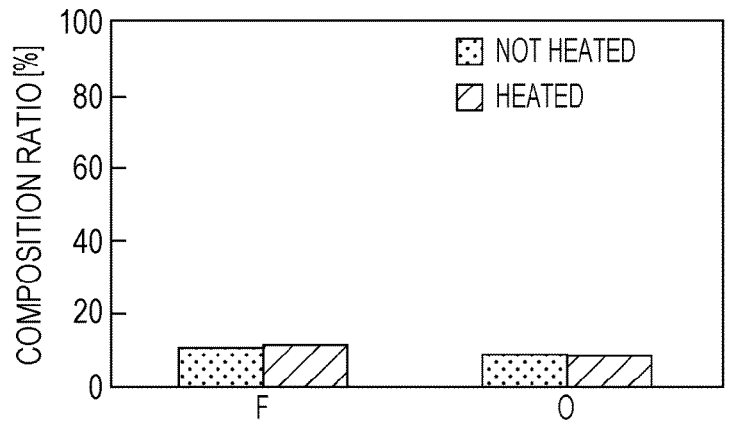
FIG. 7B is a graph showing XPS measurement results of a first PI film in the case of using a silicon substrate as a support substrate.

FIG. 5 is a graph showing the composition ratio of a surface of the glass substrate 101 of each of Samples 1 and 2, the composition ratio being obtained from XPS measurement results. FIG. 6A is a graph showing the composition ratios of F and O in a surface of the glass substrate 101 of each of Sample 1 (heated) and Sample 2 (not heated). FIG. 6B is a graph showing the composition ratios of F and O in a surface of the first PI film 102 of each of Sample 1 (heated) and Sample 2 (not heated). FIG. 7A is a graph showing the composition ratios of F and O in a surface of the silicon wafer of each of Sample 3 (silicon wafer, heated) and Sample 4 (silicon wafer, not heated). FIG. 7B is a graph showing the composition ratios of F and O in a surface of the first PI film 102 of each of Sample 3 (silicon wafer, heated) and Sample 4 (silicon wafer, not heated).

As is clear from XPS measurement results shown in FIG. 5, Samples 1 and 2 contain C, N, O, F, Mg, Al, Si, and Ca. In FIG. 5, the sum of the composition ratios of these eight elements is 1. As is clear from FIG. 5, the composition ratios of F and O vary significantly depending on whether the process of heating is performed (before and after the process of heating).

Among the above eight elements, FIGS. 6A to 7B show the composition ratios of F and O in Samples 1 to 4 because the composition ratios of F and O vary significantly depending on whether the process of heating is performed.

As is clear from FIGS. 7A and 7B, the composition ratios of F and O in Samples 3 and 4, in which the silicon wafers are used as support substrates, do not substantially vary depending on whether heating is performed. However, as shown in FIGS. 6A and 6B, the composition ratios of F and O in Samples 1 and 2, in which the glass substrate 101 is used, vary significantly after heating. Referring to FIGS. 6A and 6B, F is increased and O is reduced in a surface of the glass substrate 101 and a surface of the first PI film 102.

From this result, the present inventor thought that a major cause of film peeling is the elimination of oxygen. In order to reveal what reaction occurs in a heating step, the surface of the glass substrate 101 that was in contact with the first PI film 102 was analyzed in detail.

Figure 8:
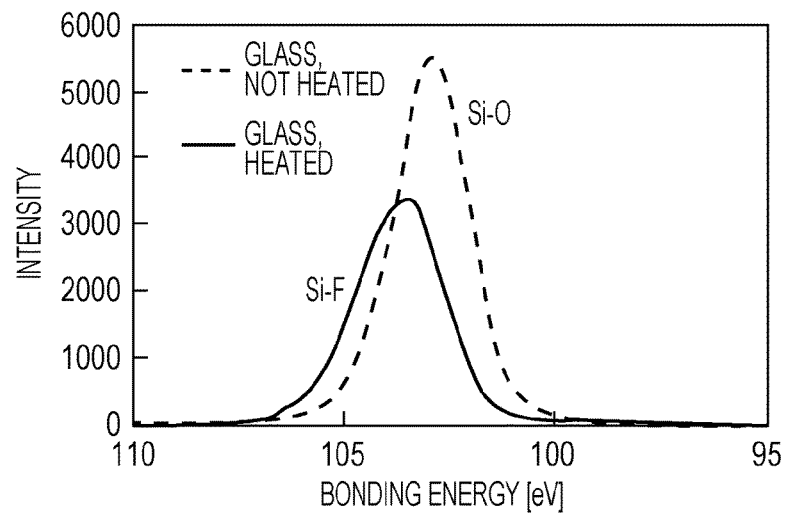
FIG. 8 is a graph showing Si 2p spectra of a surface of a glass substrate in the case of using the glass substrate as a support substrate.
Figure 9:
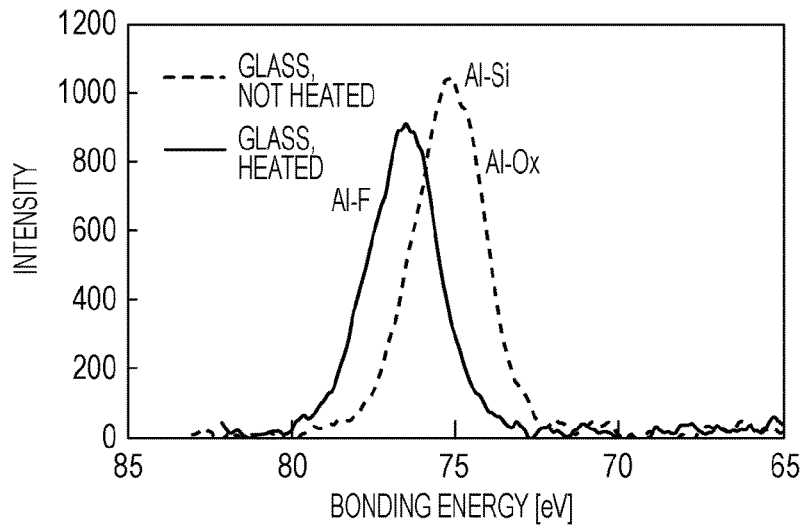
FIG. 9 is a graph showing Al 2p spectra of a surface of a glass substrate in the case of using the glass substrate as a support substrate.

FIG. 8 is a graph showing Si 2p spectra. FIG. 9 is a graph showing Al 2p spectra. In each of FIGS. 8 and 9, the following spectra are shown: a spectrum obtained in the case where heating was performed and a spectrum obtained in the case where heating was not performed.

In FIG. 8, there is a peak at the position of energy showing the presence of Si—O when the case where heating was not performed. The peak in the graph shifts to the position of energy showing the presence of Si—F when heating was performed. This suggests that Si combines with F, which has high electronegativity, and Si—O is replaced with Si—F.

In FIG. 9, there is a peak at the position of energy showing the presence of Al—Si and Al-Ox when heating was not performed. The peak in the graph shifts to the position of energy showing the presence of Al—F when heating was performed. This suggests that Al combines with F, which has high electronegativity, and Al—Si and Al-Ox are replaced with Al—F.

From the above verification results, it is conceivable that, in the glass substrate 101, reactions represented by the following equations occur at the interface between the glass substrate 101 and the first PI film 102 and delamination is caused by eliminated O:

$$SiO_2 + 4F \rightarrow SiF_4 + O_2 \qquad (2)$$

$$Al(OH)_3 + 3F \rightarrow AlF_3 + H_2O + O_2 + 1/2H_2 \qquad (3)$$

From Equations (2) and (3), it is conceivable that $SiO_2$ and $Al(OH)_3$ contained in the glass substrate 101 reacted with fluorine contained in the first PI film 102 to generated bubbles of $O_2$ and the like. The generated bubbles are schematically shown as bubbles 106 in FIG. 3. The bubbles 106 probably stayed between the first PI film 102 and the glass substrate 101 to separate the glass substrate 101 and the first PI film 102 from each other. Since the first PI film 102 was permeable to oxygen, the bubbles 106 were probably generated between the first PI film 102 and the first SiN film 103.

2. Method for Fabricating Electronic Element

In the method for fabricating the electronic element according to this embodiment, a delamination-preventing film is formed between a glass substrate 101 and a first polyimide film.

Figure 10:
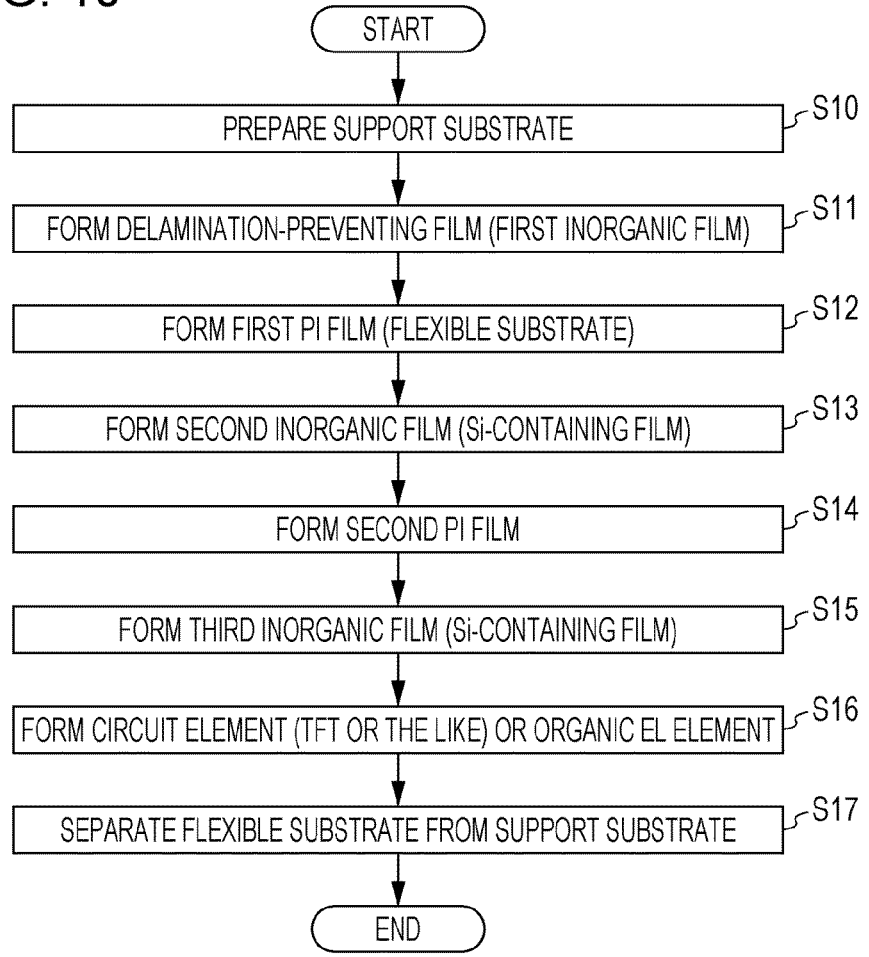
FIG. 10 is a flowchart showing steps of a method for fabricating an electronic element according to the present disclosure.

FIG. 10 is a flowchart showing steps of the method for fabricating the electronic element according to this embodiment.

Figure 11:
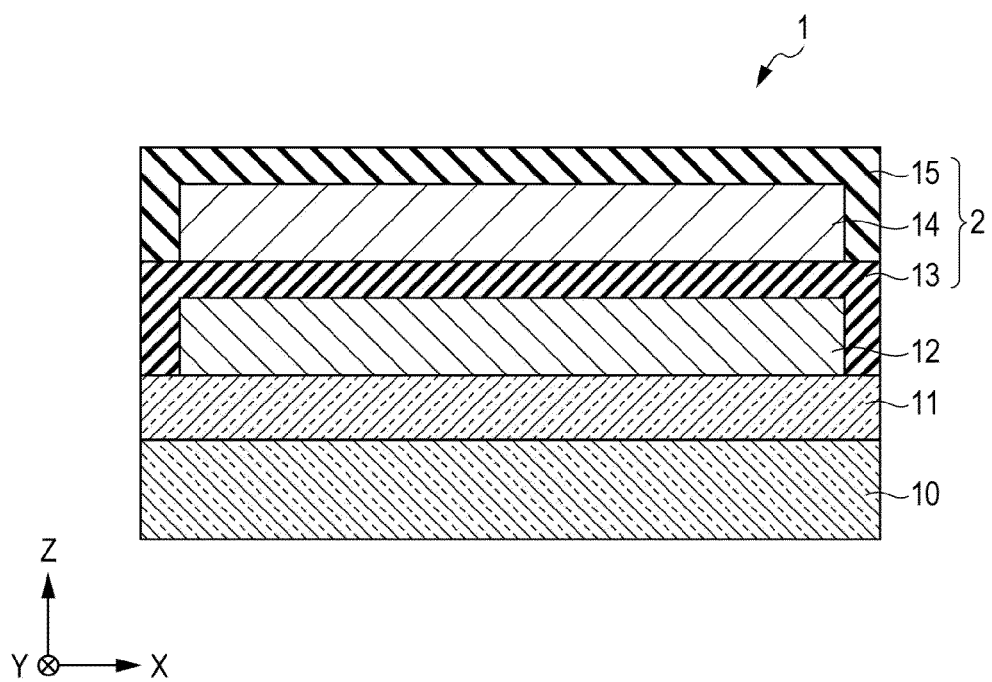
FIG. 11 is a sectional view showing an example of an intermediate member of an electronic element according to the present disclosure, the intermediate member being provided with a delamination-preventing film.

FIG. 11 is a sectional view showing an example of the configuration of an intermediate member prepared in this embodiment. In FIG. 11, among components of the electronic element that are included in the intermediate member, a first polyimide film 12 which is a flexible substrate and a protective film 2 are exemplified. Other components of the electronic element are omitted in FIG. 11. FIG. 11 is schematic and therefore does not precisely reflect the thickness of each layer (film) or the like.

As shown in FIGS. 10 and 11, a glass substrate 10 is prepared as a support substrate (a support substrate-preparing step, 510). The glass substrate 10 comprises glass. The glass substrate 10 mainly contains $SiO_2$ and is contaminated with one or more impurities such as $Al(OH)_3$ as represented by Equations (2) and (3). The glass substrate 10 has a first principal surface. In this embodiment, the glass substrate 10 has a thickness of 0.7 mm, for example.

A delamination-preventing film 11 containing silicon is formed on a surface (e.g. the first principal surface) of the glass substrate 10 (S11). The delamination-preventing film 11 is an example of a first inorganic film. A material for forming the delamination-preventing film 11 is one that is unreactive with F contained in a fluorinated PI film formed in a subsequent step. The material for forming the delamination-preventing film 11 is desirably a transparent material that does not prevent the transmission of a laser beam used in a step of separating a flexible substrate from the glass substrate 10. Such a material includes, for example, at least one selected from the group consisting of silicon nitride, silicon oxynitride, silicon oxide, and silicon oxycarbide. In this embodiment, silicon nitride (SiN) is use to form the delamination-preventing film 11. The delamination-preventing film 11 is formed by, for example, plasma CVD. The delamination-preventing film 11 has a second principal surface and a third principal surface opposite to the second principal surface. The first principal surface of the glass substrate 10 is in contact with the second principal surface of the delamination-preventing film 11. For example, whole or more than 50%, 70% or 90% of the first principal surface of the glass substrate 10 is covered by the second principal surface of the delamination-preventing film 11.

The delamination-preventing film 11 desirably has a thickness of 10 nm or more. The upper limit of the thickness of the delamination-preventing film 11 is appropriately determined in view of the intensity of the laser beam used to separate the delamination-preventing film 11 from the glass substrate 10 in a subsequent step.

After the delamination-preventing film 11 is formed, a first PI film 12 (flexible substrate) is formed on a surface portion (e.g. the third principal surface) of the delamination-preventing film 11 (S12). In the first PI film 12, fluorine is incorporated in a molecular chain of PI. The first PI film 12 is formed in such a manner that, for example, a PI material containing fluorine is applied to the delamination-preventing film 11 and is subjected to prebaking, curing, and the like. In this embodiment, the first PI film 12 is formed so as to have a thickness of 20 μm, for example. The first PI film 12 is not in contact with the glass substrate 10 since the delamination-preventing film 11 exists between the first PI film 12 and the delamination-preventing film 11.

After the first PI film 12 is formed, a second inorganic film 13 is formed (S13). A material for forming the second inorganic film 13 may be one that is impermeable to oxygen. Such a material, for example, contains at least one selected from the group consisting of silicon nitride, silicon oxynitride, silicon oxide, silicon oxycarbide, and metal. The second inorganic film 13 is formed by, for example, plasma CVD. The second inorganic film 13 is formed so as to cover the upper surface and side surfaces of the first PI film 12 (that is, surfaces that are out of contact with the delamination-preventing film 11). The second inorganic film 13 is formed so as to have a thickness of 200 nm, for example.

After the second inorganic film 13 is formed, a second PI film 14 is formed (S14). A material and method for forming the second PI film 14 may be the same as those for forming the first PI film 12. The second PI film 14 may contain hygroscopic material. In this embodiment, the second PI film 14 is formed so as to have a thickness of 5 μm, for example.

After the second PI film 14 is formed, a third inorganic film 15 is formed over the second PI film 14 (S15). The third inorganic film 15 is a SiN film and has a thickness of 200 nm, for example. An intermediate member 1 of the electronic element is fabricated by performing Steps S11 to S15. In the present disclosure, the intermediate member 1 includes the glass substrate 10, which is an example of a support substrate, the delamination-preventing film 11, which is an example of a first inorganic film, the first PI film 12, and the protective film 2.

After the third inorganic film 15 is formed, at least one of a circuit element and an organic EL element is formed (S16). Examples of the circuit element include a thin-film transistor (TFT). Steps of fabricating the thin-film transistor include a process of heating.

After the circuit element is formed, the electronic element is separated from the glass substrate 10 (S17). The electronic element includes the first PI film 12, which is a flexible substrate, the protective film 2, and the circuit element. In this step, the delamination-preventing film 11 is melted in such a manner that the back surface (a surface opposite to the protective film 2) of the glass substrate 10 is irradiated with a laser beam, whereby the electronic element is separated from the glass substrate 10.

3. Effects and the Like

Figure 12:
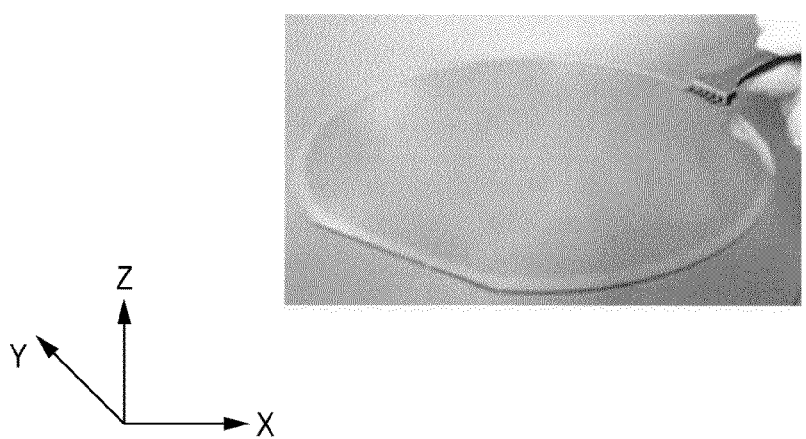
FIG. 12 is a view of an example of an intermediate member of an electronic element according to the present disclosure.

FIG. 12 is a view of an example of the intermediate member 1 prepared by the method for fabricating the electronic element. As shown in FIG. 12, delamination can be prevented by the presence of the delamination-preventing film 11. The use of the method for fabricating the electronic element according to this embodiment enables a high-quality electronic element to be fabricated with high production efficiency and yield at low cost.

Figure 13:
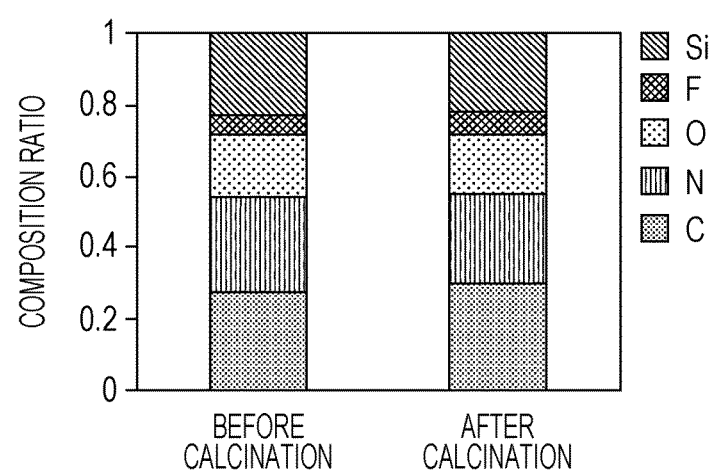
FIG. 13 is a graph showing an example the composition of a glass substrate provided with a delamination-preventing film of the present disclosure.

FIG. 13 is a graph showing the composition of the glass substrate 10 of the intermediate member 1 prepared as described above. As shown in FIG. 13, the composition ratios of fluorine and oxygen did not vary. Therefore, a material making up the glass substrate 10 was well prevented from reacting with fluorine contained in the first PI film 12.

A method for fabricating an intermediate member of an electronic element according to an aspect of the present disclosure includes: preparing a glass substrate as a support substrate having a first surface; forming a first inorganic film that contains silicon and has a second surface and a third surface opposite to the second surface, in such a manner that the first surface of the support substrate is in contact with the second surface of the first inorganic film; forming a first polyimide film containing fluorine on the third surface of the first inorganic film; and forming a second inorganic film containing silicon on the first polyimide film.

According to this aspect, delamination can be prevented in the course of fabricating the intermediate member of the electronic element and the intermediate member of the electronic element can be obtained at low cost so as to have high quality.

The method for fabricating the intermediate member may further include a step of forming a second polyimide film on the second inorganic film.

The first inorganic film may contain, for example, at least one selected from the group consisting of silicon nitride, silicon oxynitride, silicon oxide, and silicon oxycarbide.

The second inorganic film may contain, for example, a material impermeable to oxygen. Furthermore, the second inorganic film may contain at least one selected from the group consisting of silicon nitride, silicon oxynitride, silicon oxide, and silicon oxycarbide.

In the method for fabricating the intermediate member, the second polyimide film may contain a hygroscopic material.

A method for fabricating an electronic element according to an aspect of the present disclosure includes: preparing a glass substrate as a support substrate having a first surface; forming a first inorganic film that contains silicon and has a second surface and a third surface opposite to the second surface, in such a manner that the first surface of the support substrate is in contact with the second surface of the first inorganic film; forming a first polyimide film containing fluorine on the third surface of the first inorganic film; forming a second inorganic film containing silicon on the first polyimide film; forming a second polyimide film on the second inorganic film; and forming a circuit element on the second polyimide film.

According to this aspect, delamination can be prevented in the course of fabricating the electronic element and the electronic element can be obtained at low cost so as to have high quality.

In the method for fabricating the electronic element, the circuit element may be, for example, a thin-film transistor.

The method for fabricating the electronic element may further include, for example, a step of separating the first inorganic film from the support substrate by irradiating the support substrate with a laser beam after the step of forming the circuit element.

The first inorganic film may contain, for example, at least one selected from the group consisting of silicon nitride, silicon oxynitride, silicon oxide, and silicon oxycarbide.

The second inorganic film may contain, for example, a material impermeable to oxygen. Furthermore, the second inorganic film may contain at least one selected from the group consisting of silicon nitride, silicon oxynitride, silicon oxide, and silicon oxycarbide.

In the method for fabricating the electronic element, the second polyimide film may contain, for example, a hygroscopic material.

An intermediate member of an electronic element according to an aspect of the present disclosure includes a glass substrate as a support substrate having a first surface; a first inorganic film that contains silicon and has a second surface and a third surface opposite to the second surface, the second surface being in contact with the first surface of the support substrate; a first polyimide film that contains fluorine and is located on the third surface of the first inorganic film; and a second inorganic film that contains silicon and is located on the first polyimide film.

Since the intermediate member, which is formed as described above, includes the first inorganic film, which is made of a material unreactive with fluorine, a material contained in the support substrate can be prevented from reacting with fluorine contained in the first polyimide film. This enables delamination to be prevented.

The intermediate member may further include, for example, a second polyimide film located on the second inorganic film.

The intermediate member may further include, for example, a circuit element located on the second polyimide film.

In the intermediate member, the circuit element may be, for example, a thin-film transistor.

In the intermediate member, the first inorganic film may contain at least one selected from the group consisting of silicon nitride, silicon oxynitride, silicon oxide, and silicon oxycarbide.

In the intermediate member, the second inorganic film may contain a material impermeable to oxygen.

The second inorganic film may further contain at least one selected from the group consisting of silicon nitride, silicon oxynitride, silicon oxide, and silicon oxycarbide.

In the intermediate member, the second polyimide film may contain a hygroscopic material.

An electronic element according to an aspect of the present disclosure can be fabricated by the method for fabricating the electronic element according to the above aspect.

Whereas a method for fabricating an electronic element according to one or more aspects has been described above on the basis of embodiments, the present disclosure is not limited to the embodiments. Various modifications conceived by those skilled in the art may be made to the embodiments without departing from the spirit of the present disclosure and forms configured by combining constituent elements in different embodiments may be included in the scope of one or more aspects.

What is claimed is:

1. A method for fabricating an intermediate member of an electronic element, comprising:
    preparing a glass substrate as a support substrate having a first surface;
    forming a first inorganic film that contains silicon and has a second surface and a third surface opposite to the second surface, in such a manner that the first surface of the support substrate is in contact with the second surface of the first inorganic film;
    forming a first polyimide film containing fluorine on the third surface of the first inorganic film; and
    forming a second inorganic film containing silicon on the first polyimide film.

2. The method according to claim 1, further comprising forming a second polyimide film on the second inorganic film.

3. The method according to claim 1, wherein the first inorganic film contains at least one selected from the group consisting of silicon nitride, silicon oxynitride, silicon oxide, and silicon oxycarbide.

4. The method according to claim 1, wherein the second inorganic film contains a material impermeable to oxygen.

5. The method according to claim 1, wherein the second inorganic film contains at least one selected from the group consisting of silicon nitride, silicon oxynitride, silicon oxide, silicon oxycarbide, and metal.

6. The method according to claim 2, wherein the second polyimide film contains a hygroscopic material.

7. A method for fabricating an electronic element, comprising:
    preparing a glass substrate as a support substrate having a first surface;
    forming a first inorganic film that contains silicon and has a second surface and a third surface opposite to the second surface, in such a manner that the first surface of the support substrate is in contact with the second surface of the first inorganic film;

forming a first polyimide film containing fluorine on the third surface of the first inorganic film;

forming a second inorganic film containing silicon on the first polyimide film;

forming a second polyimide film on the second inorganic film; and forming a circuit element on the second polyimide film.

8. The method according to claim 7, wherein the circuit element is a thin-film transistor.

9. The method according to claim 7, further comprising separating the first inorganic film from the support substrate by irradiating the support substrate with a laser beam after forming the circuit element.

10. The method according to claim 7, wherein the first inorganic film contains at least one selected from the group consisting of silicon nitride, silicon oxynitride, silicon oxide, and silicon oxycarbide.

11. The method according to claim 7, wherein the second inorganic film contains a material impermeable to oxygen.

12. The method according to claim 7, wherein the second inorganic film may contain at least one selected from the group consisting of silicon nitride, silicon oxynitride, silicon oxide, silicon oxycarbide, and metal.

13. The method according to claim 7, wherein the second polyimide film contains a hygroscopic material.

* * * * *